United States Patent
Miki

(10) Patent No.: US 9,590,158 B2
(45) Date of Patent: Mar. 7, 2017

(54) LIGHT EMITTING DEVICE

(71) Applicant: NICHIA CORPORATION, Anan-shi, Tokushima (JP)

(72) Inventor: Tomohide Miki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/973,896

(22) Filed: Dec. 18, 2015

(65) Prior Publication Data
US 2016/0181493 A1    Jun. 23, 2016

(30) Foreign Application Priority Data

Dec. 22, 2014  (JP) ................. 2014-258845
Dec. 16, 2015  (JP) ................. 2015-244904

(51) Int. Cl.
| H01L 33/62 | (2010.01) |
| H01L 33/64 | (2010.01) |
| H01L 33/52 | (2010.01) |
| H01L 33/48 | (2010.01) |

(52) U.S. Cl.
CPC ........... *H01L 33/62* (2013.01); *H01L 33/486* (2013.01); *H01L 33/641* (2013.01); *H01L 33/642* (2013.01); *H01L 2224/48091* (2013.01); *H01L 2224/48247* (2013.01); *H01L 2224/48257* (2013.01); *H01L 2224/48465* (2013.01)

(58) Field of Classification Search
CPC ....... H01L 33/56; H01L 33/62; H01L 33/641; H01L 33/644
USPC .......................................................... 257/99
See application file for complete search history.

(56) References Cited

U.S. PATENT DOCUMENTS

| 2012/0018772 A1* | 1/2012 | Nishijima ............. H01L 33/486 257/99 |
| 2012/0168810 A1* | 7/2012 | Kobayashi ............. H01L 33/60 257/99 |

FOREIGN PATENT DOCUMENTS

| JP | 2008-192837 A | 8/2008 |
| JP | 2011-071471 A | 4/2011 |
| JP | 2011-119557 A | 6/2011 |
| JP | 2011-134961 A | 7/2011 |
| JP | 2012-174966 A | 9/2012 |
| JP | 2014-029995 A | 2/2014 |

* cited by examiner

*Primary Examiner* — Hoang-Quan Ho
(74) *Attorney, Agent, or Firm* — Global IP Counselors, LLP

(57) ABSTRACT

A light emitting device, includes: a package equipped with a lead having an upper surface and a lower surface, and a metal board and a plating layer, the upper surface including a mounting portion, the metal board whose main component is copper, the plating layer including a first plating layer and a second plating layer which are provided on the lower surface of the metal board, the first plating layer containing silver and nickel and being formed on the edge of the metal board, and the second plating layer containing no nickel and being formed on at least part of a region below the mounting portion, a molded resin that holds the lead so that the lower face of the lead is exposed to the outside; a light emitting element mounted on the mounting portion; and a sealing member that seals the light emitting element.

17 Claims, 5 Drawing Sheets

LIGHT EMITTING DEVICE

CROSS-REFERENCE TO RELATED APPLICATIONS

This application claims priority to Japanese Patent Applications No. 2014-258845 and No. 2015-244904 filed on Dec. 22, 2014 and Dec. 16, 2015. The entire disclosure of Japanese Patent Applications No. 2014-258845 and No. 2015-244904 is hereby incorporated herein by reference.

BACKGROUND

1. Field of the Invention

The present disclosure relates to a light emitting device.

2. Description of the Related Art

Among light emitting diodes (LEDs) and other such light emitting devices that make use of a semiconductor light emitting element (hereinafter referred to as a "light emitting element"), there are known devices that make use of a package made up of a resin and a lead. The main component of the lead is a metal board made of copper or the like, and the surface of which is plated.

The leads used in light emitting devices are often plated with a material having high heat dissipation property, such as copper, and another material having high reflectivity, such as silver formed thereon. Plating layer with another material first as an underlayer is a known way to make it easier to form the silver plating layer on the outermost surface of the metal board. Example of the underlayer include nickel and the like (for example, JP2011-71471A and JP2008-192837A).

SUMMARY

The light emitting device of the present disclosure includes a package, a light emitting element and a sealing member. The package is equipped with a lead and a molded resin. The lead has an upper surface including a mounting portion and a lower surface. The lead has a metal board whose main component is copper, and a plating layer. The plating layer includes a first plating layer and a second plating layer provided to the lower surface of the metal board, the first plating layer contains a silver and nickel and is formed on the edge of the metal board, and the second plating layer contains no nickel and is formed on at least part of a region under the mounting portion. The molded resin holds the lead so that the lower face of the lead is exposed to the outside. The light emitting element is mounted on the mounting portion of the lead. The sealing member seals the light emitting element.

According to the light emitting device of the present disclosure, it is possible to provide a light emitting device in which a silver-plated lead is used, with the light emitting device having improved heat dissipation.

BRIEF DESCRIPTION OF DRAWINGS

FIG. 3A is a schematic cross sectional view illustrating a light emitting device according to an embodiment of;

DETAILED DESCRIPTION OF THE EMBODIMENT

Figure 1A:
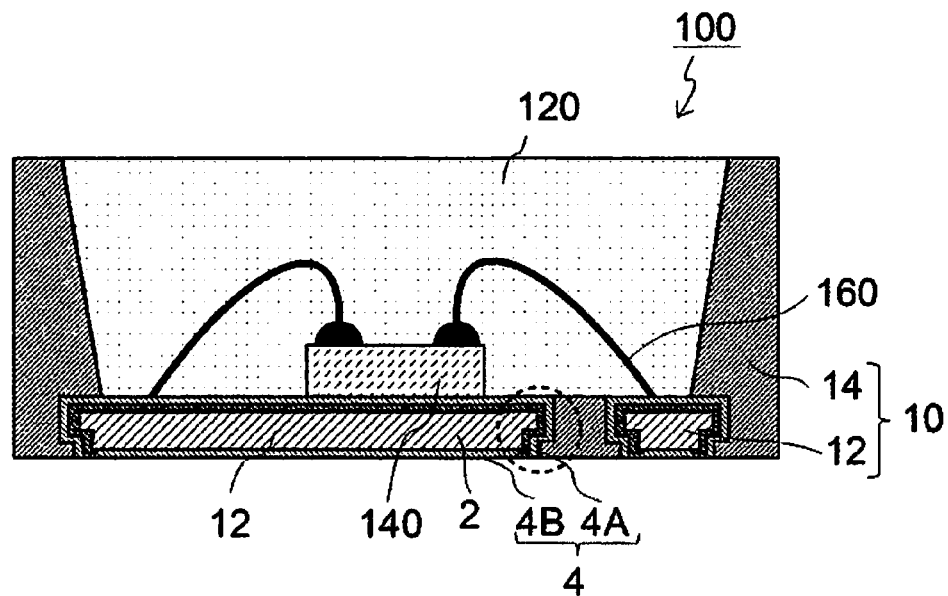
FIG. 1A is a schematic cross sectional view illustrating a light emitting device according to an embodiment.

Embodiments for implementing the light emitting device of the present invention will be described below with reference to the accompanying drawings. In the following embodiment of the light emitting device that embody the technological concept of the present invention are just examples, and so forth of the constituent parts discussed in the embodiment are not intended to limit the scope of the present invention, and are merely examples given for the sake of illustration.

In the specification, the constituent of the present invention is not intended to limit the constituent parts discussed in the embodiments. In the following embodiment, however, that embody the technological concept of the present invention are just examples, and unless otherwise specified, the dimensions, materials, shapes, relative layout. The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted.

In this Specification, in reference to the lead or the metal board, the surface that is on the side where the light emitting element is mounted when used as a light emitting device shall be called the "upper surface", the surface opposite the upper surface shall be called the "lower surface", and the surfaces between the upper surface and lower surface shall be called the "lateral side surfaces".

The light emitting device according to this embodiment is a light emitting device including a package equipped with a lead having an upper surface and a lower surface, and a molded resin that holds the lead so that the lower surface of the lead is exposed to the outside; a light emitting element mounted on an mounting portion on the upper surface of the lead; and a sealing member that seals the light emitting element. The lead has a metal board whose main component is copper, and plating layer provided to the surface of the metal board. The plating layer on the lower surface of the lead has a first plating layer that contains silver and nickel and is formed on the edge of the metal board, and a second plating layer that does not contain nickel and is formed below the mounting portion of the light emitting element.

The lower surface of the light emitting device is such that the lower surface of the lead is exposed to the outside, and is mounted to a secondary substrate with solder or another such adhesive agent. Because there is plating layer as second plating layer that has no nickel, which has low thermal conductivity, is provided directly under (or beneath) the light emitting element, heat produced by the light emitting element can be easily dissipated to the outside.

Nickel is suitable as a material that helps prevent the metal (and particularly copper) that makes up the metal board, which is the base member of the lead, from diffusing into the interior of the plating layer. Accordingly, the diffusion of copper into silver can be moderated by forming plating layer (first plating layer) that contains silver and nickel as the plating layer formed on the edge of the lower surface of the lead, and more precisely, by using plating layer (Cu/Ni/Au) in which nickel is interposed between copper and silver. Copper is susceptible to oxidation. The solder that is used for mounting to a secondary substrate does not adhere well to oxidized copper, so a region of good solderability (joinability) can be formed by forming first plating layer, in which the diffusion of copper has been moderated, on the lower surface of the lead.

As discussed above, the plating layer on the lower surface of the lead includes (preferably consists of) two kinds of plating layer, namely, plating layer with good heat dissipation (i.e., second plating layer), and plating layer with good adhesion to solder (i.e., first plating layer), and as a result, a light emitting device with good heat dissipation can be obtained with little decrease in adhesion to the secondary substrate.

Also, it is preferable to provide nickel on the side where the light emitting element is mounted, that is, the upper surface side of the lead (metal board). This makes it less likely that the metal constituting the metal board (and particularly copper) will diffuse into the interior of the plating layer, moderates the deterioration of the silver formed over this, and thereby reduces a decrease in reflectivity, a decrease in gloss, and so forth. However, because the thermal conductivity of nickel will be lower than that of the metal board, this can lead to a drop in heat dissipation. Accordingly, the plating layer formed in the region where light from the light emitting element is not applied, that is, the plating layer formed on the lower surface of the metal board, can be plating layer that does not contain nickel (i.e., second plating layer), and this helps avoid a decrease in heat dissipation.

Package

The package comprises a lead and a molded resin that holds the lead. The package can have a flat shape, or it can have a shape in which a recess that allows the light emitting element to be mounted is provided, etc. With a flat package, the upper surface of the lead is exposed on the upper surface of the package. With a package having a recess, the upper surface of the lead is exposed on the bottom surface of the recess. The bottom surface of a lead is exposed on the lower surface of the package.

Lead

The lead functions as the electrodes of the light emitting device, and has at least two leads: a positive electrode lead and a negative electrode lead. The leads are flat metal members that have been patterned in a specific shape, and have a metal board that serves as the base member, and plating layer formed on the surface of the metal board. The lead may have a portion which does not function as the electrodes of the light emitting device such as a heat dissipation portion.

Metal Board

The metal board is patterned in the desired shape by etching, pressing, punching, blasting, or another such working method. The metal board is worked so as to have a plurality of patterns so that a plurality of light emitting devices can be obtained with a leadframe. Each pattern includes parts that function as heat dissipation portions or the like, or a pair of positive and negative leads that function as electrode terminals when used as a light emitting device, and furthermore there are linking portions for linking the various patterns, other parts, etc. There may also be cut-off portions, recesses, holes, or the like. This working can be performed before or after the plating, but is preferably performed before plating.

Examples of the material of the metal board include copper, aluminum, silver, gold, zinc, chrome, tungsten, cobalt, nobelium, rhodium, ruthenium, and other such metals and alloys of these. A single layer may be used, or a multi-layer structure, such as a clad material can be used. It is preferable to include copper as the main component, for example, at 90% by weight or more. Also, silicon, phosphorus, and other such non-metals may be contained as trace elements.

The thickness of the metal board is preferably between about 100 and 1000 µm, for example, and more preferably between about 200 and 500 µm. The entire metal board may have this thickness, or part of it may be thinner. In particular, the portion that becomes the edge in patterning may have a shape that includes a depressed portion on the lower surface side of the lateral side surface, or in other words, a shape that includes a protruding portion on the upper surface side of the lateral side surface. The thickness of this protruding portion can be about one-half to one-fifth the thickness of the other portions (such as directly below the light emitting element). Using such shape improves adhesion between the lead and the molded resin when a package is formed. Also, in the case where the lead is disposed so as to be exposed on the lower surface of the package, this protruding portion or depressed portion provided to the edge of the lead will provide an anchoring effect that prevents the lead from coming loose from the molded resin.

Plating Layer

Plating layer is provided to the surface of the metal board. The lower surface of the metal board is plated with two different compositions: a first plating layer that contains silver and nickel, and a second plating layer that does not contain nickel. The second plating layer is provided beneath (directly under) the mounting portion of the light emitting element. The second plating layer may be provided to at least part of the area beneath the mounting portion of the light emitting element, and preferably is provided beneath the entire region of the mounting portion of the light emitting element. The first plating layer is provided to the edge of the lower surface of the metal board. In this case, the first plating layer may be provided to at least part of the edge of the lower surface of the metal board, and may further be provided to the edge that extends about one-half to one-fifth the way around, and may be provided all the way around. The lead where no light emitting element is mounted does not necessarily have to be provided with the second plating layer on its lower surface (i.e., the lower surface of the metal board). For example, the first plating layer may be provided over the entire surface, or a third plating layer that is different from the first and second plating layer may be provided, or no plating layer may be provided so that the metal board is left exposed.

A degreasing process is preferably provided to remove organic substances from the lead surface, as a pretreatment prior to forming the first and second plating. Furthermore, lead surface activation is preferably performed by acid treatment or the like following the degreasing step.

In this Specification, metal elements of the "nickel" and "silver" that make up the plating layer do not refer to plating layer composed solely of these metals, and instead, as referred to the fact, these are the main components, and refer to a material that contains at least 70 wt % nickel or silver. Specifically, this terminology is used merely for the sake of convenience, and encompasses situations in which the plating layer contains unavoidable impurities, materials of less than 30 wt %, etc.

First Plating Layer

The first plating layer, which includes nickel and silver formed on the nickel, is provided to part of the lower surface of the metal board. More precisely, the lower surface of the metal board, at least part of the area beneath the mounting portion of the light emitting element is provided with the second plating layer, and the first plating layer is provided to a different region from that of the second plating layer. Specifically, the first plating layer is provided to the lower surface of the metal board, except for at least part of the region where the light emitting element is mounted. For example, the first plating layer can be provided to the edge of the lower surface of the metal board so as to be continuous from the lateral side surfaces.

As discussed above, nickel not only reduces diffusion of copper and other such elements of the metal board into the plating layer (silver as the element), but also improves the adhesion of the respective plating layers. Accordingly, by providing the first plating layer, which contains nickel and is formed with good silver adhesion, to part of the lower surface of the metal board (and particularly to the edge), the silver plating layer can be positioned on the outermost surface in a state of moderated diffusion of copper, and good solder adhesion can be achieved.

In addition to nickel and silver, other materials can also be stacked in the first plating layer structure. Examples of such materials include gold, copper, platinum, palladium, aluminum, tungsten, molybdenum, ruthenium, and rhodium. Examples of the multi-layer structure include Ni/Ag, Ni/Pd/Ag, Ni/Pd/Au/Ag, Ni/Pt/Ag, Ni/Au/Ag and Cu/Ni/Pd. Among them, the laminated structure of Ni/Pd/Au/Ag and Ni/Au/Ag are particularly preferable.

Also, the first plating layer may be provided to the upper surface and lateral side surfaces of the metal board. For instance, the first plating layer is formed continuously on the upper surface and the lateral side surfaces of the metal board by covering part of the lower surface of the patterned metal board (beneath the region where the light emitting element is mounted) with a mask (such as a resist mask or a mask made of protective tape), dipping it in a plating bath to form nickel plating layer, and then removing the mask and forming silver plating layer. When the silver plating layer is formed in this way, it is formed integrally as plating layer which has both the first plating layer and the second plating layer. A configuration such as this can be achieved by applying a partial nickel plating layer as an underlayer. The first plating layer and the second plating layer may thus share part of the plating layer, or they may have completely different configurations.

The first plating layer formed continuously with the lower surface, the lateral side surfaces and the upper surface of the metal board allows corrosion of the base metal in the first plating layer to be moderated, compared with the first plating layer formed only on the lower surface of the metal board.

In the case of including the protruding portion on the upper surface side of the lateral side surface of the metal board, the first plating layer is preferably formed on the lateral side surfaces and a lower surface of the protruding portion. Further, the first plating layer is preferably formed on the lateral side surfaces of the depressed portion of the metal board which is located under the protruding portion on the lateral side surface of the metal board.

The lead has an exposed portion on the lateral side surface of the light emitting device. In the case that the each light emitting device is formed by separating an array of the light emitting devices, the lateral side surfaces are formed from the separation surfaces. That is, the lateral side surfaces of the light emitting device are formed from a separation face of the molded resin and a separation face of the lead. The plating layer is formed before the molded resin is formed, in other words, the plating layer is formed on each lead in the state of the lead frame. Therefore, the lateral side surfaces of the lead which are formed by separating of the array of the light emitting devices, in other words, the side surfaces which are exposed on the lateral side surface of the light emitting device, are not covered by the plating layer. The plating layer is formed so as to surround the metal board at the lateral side surface of the metal board. The exposed plating layer here is the first plating layer, and contains nickel. Since nickel is harder than the metal board of copper, the separation portion of the first plating layer containing nickel allows burr of copper to be reduced.

Also, in the plating step, when a masking belt is used rather than a resist mask or a mask made of protective tape, the belt that comes into contact with the edge of the patterned portion of the lower surface of the metal board does not fit so snugly that there is no gap, so the first plating layer is also formed between the metal board and the belt. Consequently, the nickel plating layer is formed so that the thickness is different on the lower surface of the metal board. In this case, the plating layer may be formed so that it becomes thinner as it is farther away from the end of the lower surface of the metal board.

Second Plating Layer

The portion of the lower surface of the metal board that is beneath the region where the light emitting element is mounted has second plating layer that does not contain nickel. The no nickel here is defined to mean that no nickel is intentionally used or added when forming the second plating layer; however, there is a room for a possible presence of impurities that might contain nickel. The second plating layer may be provided beneath at least a part of the region where the light emitting element is mounted, and preferably is provided over at least half the region where the light emitting element is mounted, and more preferably is provided beneath the entire mounting region. Also, the first plating layer is provided to part of the lower surface of the metal board, and the second plating layer is preferably provided so as to come into contact with this first plating layer. That is, the second plating layer does not contain nickel.

The second plating layer can be formed simultaneously with part of the plating layer that makes up the first plating layer. For example, in forming nickel plating layer on the upper surface of the metal board, in the case where a location corresponding to beneath the region where the light emitting element is mounted is masked and plated, and the entire surface of the metal board is plated with something other than nickel without any masking, plating layer of part of the first plating layer (plating layer other than nickel) and the second plating layer can be formed in the same step. This method realize a structure in which the plating layer other than nickel is provided continuously from the upper surface to the lower surface of the metal board.

Examples of the material of the second plating layer include silver, gold, copper, cobalt, zinc, rhodium, chromium, aluminum, tungsten, molybdenum, ruthenium, and rhodium. These can be used singly, or, just as with the first plating layer, a multi-layer structure can be used in which the second plating layer also includes an underlayer or the like. Au/Ag is an example of a multi-layer structure.

Also, plating may be performed for forming third plating layer after the molded resin has been formed. A Plating layer (e.g., solder plating layer) that contains lead, tin, silver, copper, bismuth, or the like, for example, may be formed as this third plating layer. In the case where plating layer is thus formed after molding, the lower surface of the lead will have a shape that protrudes more than the lower surface of the molded resin, and stable joint strength can be maintained during secondary mounting. Also, since the plating layer is formed after molding, it can be formed on only where needed, which reduces the amount of material used.

The total thicknesses of the first plating layer and second plating layer is preferably between about 1 and 10 µm, and more preferably between 1.5 and 6 µm, respectively. The thickness of each layer can be suitably selected as dictated by the intended application. For instance, the thickness of the nickel layer may be about between 0.1 and 5 µm, preferably between about 0.5 and 5 µm, palladium between about 0.005 and 0.05 µm, gold between about 0.001 and 0.5 µm, and silver between about 1 and 5 µm.

Molded Resin

The molded resin functions as a holding member that integrally holds at least two leads in producing a light emitting device, and also functions as a member that controls optical characteristics, such as optical reflectivity and light blocking. The molded resin is provided between a pair of leads, and also functions as an insulating member that keeps the positive and negative leads from coming into contact with each other.

The reads are preferably disposed so that their lower surfaces are exposed from the lower surface of the package. The upper surface of a lead includes an element mounting region where a light emitting element is mounted, and, when a wire is used, a wire connection region where a wire is connected. These are disposed so as to be exposed from the molded resin.

Examples of the resin material used for the molded resin include thermosetting resins, thermoplastic resins, and other such resins. Specific Examples of the thermosetting resin include an epoxy resin composition; a silicone resin composition; a modified epoxy resin composition, a modified silicone resin composition, a silicone modified epoxy resin; an epoxy modified silicone resin; a polyimide resin composition, a modified polyimide resin composition, an unsaturated polyester resin composition, diallyl phthalate, and specific examples of the thermoplastic resin include a polyamide, a polyphthalamide (PPA), a polycarbonate resin; a polyphenylene sulfide (PPS); a liquid crystal polymer (LCP); an ABS resin (an acrylonitrile-butadiene-styrene resin); a phenolic resin; an acrylic resin; and a PBT resin (polybutylene terephthalate resin). These may be used singly, or by a combination of two or more types. A thermosetting resin is particularly preferable. It is especially preferable for the molded resin to be one whose reflectivity with respect to the light from the light emitting element is at least 60%, more preferably 70%, 80%, or 90% or more when used for a light emitting device.

The molded resin may also contain titanium oxide or another such light reflecting material. Examples of the reflecting material include titanium oxide, silicon oxide, zirconium oxide, potassium titanate, alumina, aluminum nitride, zinc oxide, boron nitride and mullite. This allows the light from the light emitting element to be reflected efficiently. It may also contain carbon black or another such black-color material. The light reflecting material or black-color material can be suitably adjusted according to the molding conditions, such as resin molding method, resin fluidity, or according to the reflectivity, mechanical strength, or other such characteristics. For instance, when titanium oxide is used, it is preferably contained in an amount of between 10 and 60 wt %, and more preferably between 15 and 50 wt %, with respect to the total weight of the molded resin.

Light Emitting Element

The light emitting element is constituted by a semiconductor layer including a light emitting layer, stacked on an element substrate. Alternatively, it may be constituted by a semiconductor layer obtained by removing the substrate after stacking a semiconductor layer that includes a light emitting layer on an element substrate.

There are no particular restrictions on the element substrate, but an example is one that is normally used to grow a nitride semiconductor layer. A light-transmissive substrate is particularly preferable. The term light-transmissive here refers to a property of being able to transmit at least about 60%, 65%, 70% or 80% of the light emitted from the light emitting element. Example thereof include sapphire, spinel, NGO, $LiAlO_2$, $LiGaO_3$ and GaN. An element substrate composed of an oxide is particularly preferable, an element substrate composed of a Wurtzite type crystal is more preferable, and sapphire is still more preferable.

The semiconductor layer stacked on the element substrate preferably has at least a light emitting structure. More specifically, the semiconductor layer is configured, for example, such that a first semiconductor layer (i.e., n-type or p-type semiconductor layer), a light emitting layer, optionally via a buffer layer or other such layer or layers, and a second semiconductor layer (I.e., p-type or n-type semiconductor layer) are stacked in that order on a substrate.

In this semiconductor layer, part of region is removed in the thickness direction from the second semiconductor layer side, that is, the layer is partially removed, the first semiconductor layer is exposed from there, and the light emitting layer and the second semiconductor layer are stacked in that order on the other region of the first semiconductor layer besides this exposed region.

There are no particular restrictions on the first semiconductor layer, light emitting layer, and second semiconductor layer that make up the semiconductor layer, but a nitride compound semiconductor such as $In_XAl_YGa_{1-X-Y}N$ ($0 \leq X$, $0 \leq Y$, $X+Y \leq 1$) can be used to advantage, for example. The nitride semiconductor layer may be a single-layer structure, or it may be multi-layer structure having layers of different composition, thickness, and so forth, a super-lattice structure, or the like. It is particularly favorable for the light emitting layer to have a single quantum well or a multiple quantum well structure in which thin-films with a quantum effect are stacked.

A pair of electrodes had by the light emitting element are disposed on the same surface side of the semiconductor layer. These electrodes may have a single-layer structure or a multi-layer structure, so long as they are ohmically connected so that the current-voltage characteristics are linear or substantially linear. These electrodes can be formed in the desired thickness, with any configuration and materials that are known in this field. For example, the thickness is preferably between a few dozen microns about 300 µm.

In particular, in the case where the pair of electrodes of the light emitting element are each electrically connected to leads via a joining member, it is preferable to dispose a reflective layer (e.g., a plating layer or DBRs) as the layer of the electrodes closest to the semiconductor layer side.

Also, the light emitting element may be a white light emitting element in which a phosphor layer has been formed in advance, or a white light emitting element in which a phosphor layer has been formed on the upper surface, and lateral side surfaces of the light emitting element is covered by a resin or by a metal or another such reflective layer. Furthermore, a light emitting element can be used in which the thickness of the electrodes disposed on the mounting surface from the light emitting element is increased, and a resin (i.e., white resin) or other such stress moderation layer is provided around the periphery thereof.

Joining Members

The pair of electrodes of the light emitting element are electrically connected to the leads via a wire or a joining member.

An insulating joining member or a conductive joining member can be used, for example, as the joining member. A resin is an example of an insulating joining member, which can be a light transmissive resin, a white resin, or the like. Examples of conductive joining members include eutectic materials such as those based on alloys whose main components are gold and tin, alloys whose main components are gold and silicone, alloys whose main components are gold and germanium, and solder such as those based on alloys whose main components are silver, copper and tin, those based on alloys whose main components are copper and tin, those based on alloys whose main components are bismuth and tin. Of these, a eutectic alloy of Au—Sn is preferable. Using an Au—Sn eutectic alloymoderates degradation caused by thermal compression bonding on the electrodes of the light emitting element, and it can be joined more securely to the leads.

Sealing Members

The sealing members are used to protect the light emitting element, a protective element, a wire, or other such electronic parts mounted in the package against dust, moisture, external force, and the like. The material of the sealing member is preferably transmissive enough to transmit the light from the light emitting element, and is light resistant enough not to be readily degraded by the light. Specific examples of materials include silicone resin compositions, modified silicone resin compositions, epoxy resin compositions, modified epoxy resin compositions, acrylic resin compositions, and other such insulating resin compositions that are transmissive enough to transmit the light from the light emitting element. It is also possible to use a silicone resin, an epoxy resin, a urea resin, a fluororesin, a hybrid resin that includes one or more of these resins, or the like. Furthermore, the sealing member is not limited to being one of these organic substances, and can instead be glass, a silica sol, or another such inorganic material. In addition to these materials, a colorant, a light diffusing agent, a light reflecting material, any of various fillers, a wavelength conversion member (e.g., fluorescent member), or the like can also be contained as desired. The sealing member may be used in an amount large enough to cover the above-mentioned electronic parts.

The shape of the outer surface of the sealing member can be variously selected according to the light distribution characteristics and so forth. Directional characteristics can be adjusted by giving the upper surface a convex lens shape, a concave lens shape, a Fresnel lens shape, or the like, for example. Also, a lens member may be provided in addition to the sealing member. Furthermore, in the case where a phosphor-containing molded article (such as a phosphor-containing flat molded article, or a phosphor-containing dome-shaped molded article) is used, it is preferable to select a material with good adhesion to the phosphor-containing molded article as the sealing member. Besides a resin composition, glass or another such inorganic substance can be used as the phosphor-containing molded article.

Examples of phosphors include oxide-based phosphor, sulfide-based phosphor, and nitride-based phosphor. For instance, when a gallium nitride light emitting element that emits blue light is used as the light emitting element, examples include LAG materials and YAG materials that absorb blue light and emit yellow to green light, SiAlON (β-SiAlON) materials that emit green light, SCASN materials, CASN materials, KSF-based phosphors ($K_2SiF_6$:Mn), and sulfide-based phosphors that emit red light, and other such phosphors, which can be used singly or in combination.

The light emitting device may further have a Zener diode, a bridge diode, or another such protective element.

EMBODIMENT 1

Figure 1B:
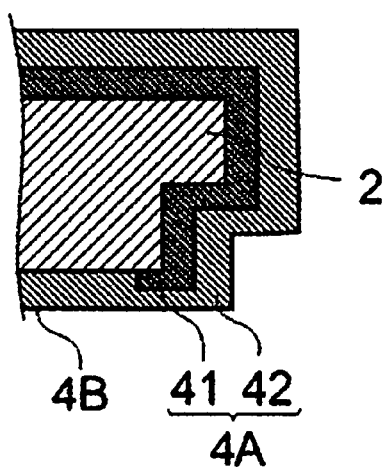
FIG. 1B is a partial enlarged view of the leas of FIG. 1A.
Figure 1C:
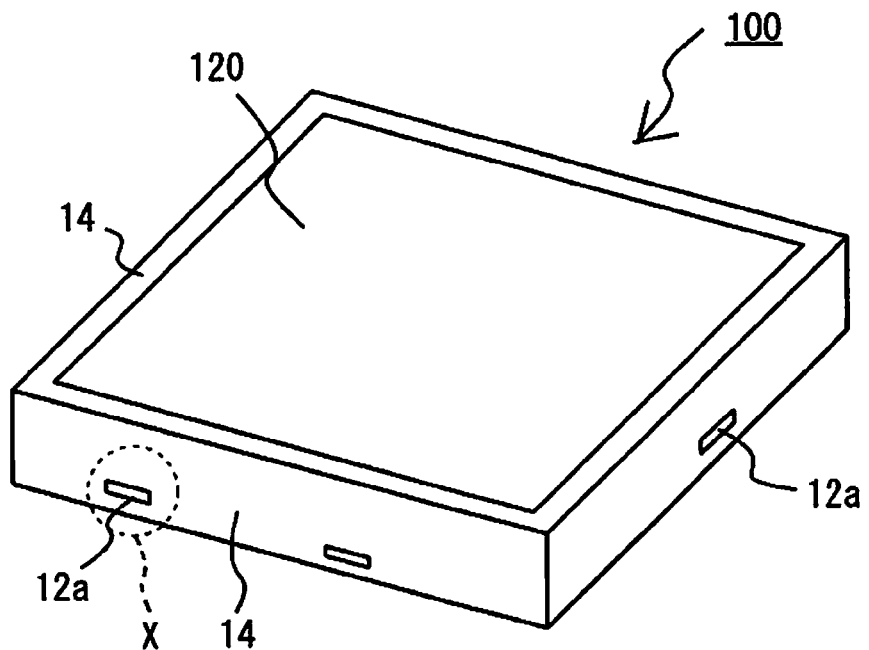
FIG. 1C is a schematic perspective view of the light emitting device of FIG. 1A.
Figure 1D:
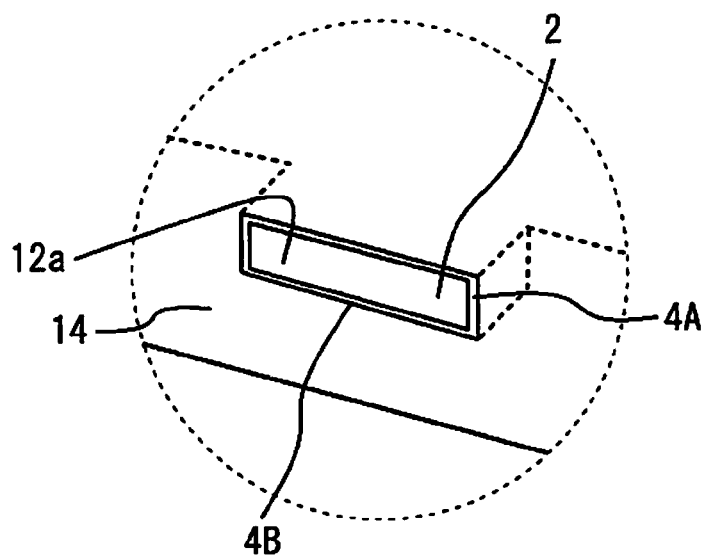
FIG. 1D is an enlarged view of X in FIG. 1C.

FIG. 1A is a schematic cross sectional view of a light emitting device 100 according to Embodiment 1, and FIG. 1B is a partial enlarged view of the lead 12, FIG. 1C is a schematic perspective view of the light emitting device of FIG. 1A, and FIG. 1D is an enlarged view of X in FIG. 1C. The light emitting device 100 includes a package 10 equipped with a recessed portion, a light emitting element 140 that is mounted on the bottom surface of the recessed portion of the package 10, and a sealing member 120 that fills the recessed portion so as to cover the light emitting element 140. The light emitting element 140 is electrically connected to leads 12 via wires 160. The package 10 includes two leads 12 that become a pair of positive and negative electrodes, and a molded resin 14 that holds the leads and has a bottom surface and lateral side surfaces. Parts of the upper surfaces of the leads 12 are exposed at the bottom surface of the recessed portion, and substantially all of the lower surfaces are exposed and disposed so as to become the lower surface of the light emitting device 100. The leads 12 has exposed portions 12a which are exposed on the lateral side surfaces of the light emitting device as shown in FIG. 1C.

The each lead 12 includes a metal board 2 composed of copper as the base member of the leads and plating layer 4 that is formed on the surface of the metal board 2. The lower surface of the metal board is provided with first plating layer 4A in which nickel layer 41 and silver layer 42 are stacked, and second plating layer 4B that does not include nickel. The nickel layer 41 is provided in a substantially uniform thickness over the lower surface of the metal board 2. This can be obtained by providing a mask using protective tape over the lower surface of the metal board 2 and plating layer with nickel.

The second plating layer 4B is provided integrally with the silver layer 42 in the first plating layer 4A. On the lower surface of the metal board 2, the first plating layer 4A and the second plating layer 4B are formed so that their surfaces are flush. The first plating layer 4A, the second plating layer 4B, and the molded resin 14 are formed so that they will be flush at the lower surface of the light emitting device.

Plating layer with the same constitution as the first plating layer 4A provided to the lower surface of the metal board 2 is provided over the entire upper surface of the metal board 2. The exposed portion 12a, which is exposed on the lateral side surface of the light emitting device, is formed such that the first plating layer 4A and the second plating layer 4B surround the surface of the metal board 2 as shown in FIG. 1D.

This configuration allows heat from the light emitting element to be easily released to the outside. It also moderates a decrease in joinability of the leads with solder. Further, the plating layer containing nickel at a portion in which the exposed lead is cut allows burr of the metal board 2 to be suppressed.

EMBODIMENT 2

Figure 2:
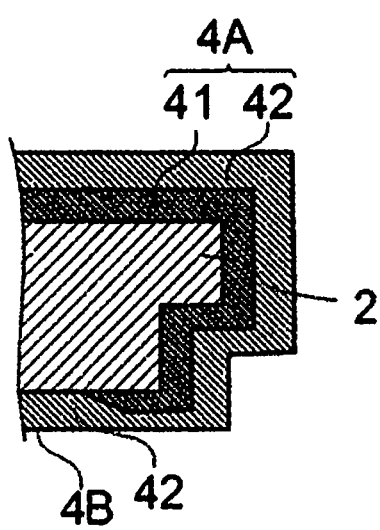
FIG. 2 is a schematic cross sectional view illustrating part of the lead according to an embodiment.

FIG. 2 is a partial enlarged view of the leads 12. In Embodiment 2, the first plating layer 4A provided to the lower surface of the metal board 2, the thickness of the nickel 41 is not uniform, and instead varies. More precisely, this differs from Embodiment 1 in that the thickness decreases as it is farther away from the end of the lower surface of the metal board 2. This is obtained by applying a masking belt so as to come into contact with the lower surface of the metal board 2 for plating layer with nickel.

EMBODIMENT 3

Figure 3A:
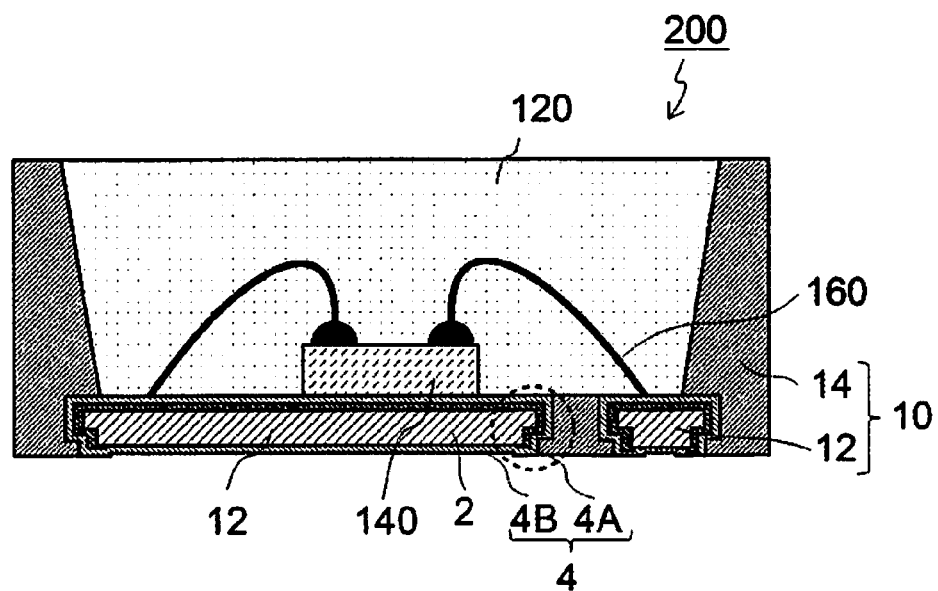
Figure 3B:
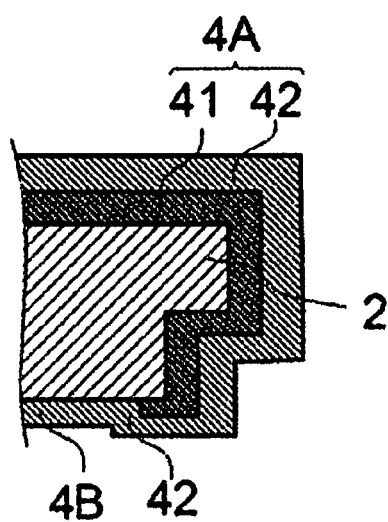
FIG. 3B is a partial enlarged view of FIG. 3A.
Figure 3C:
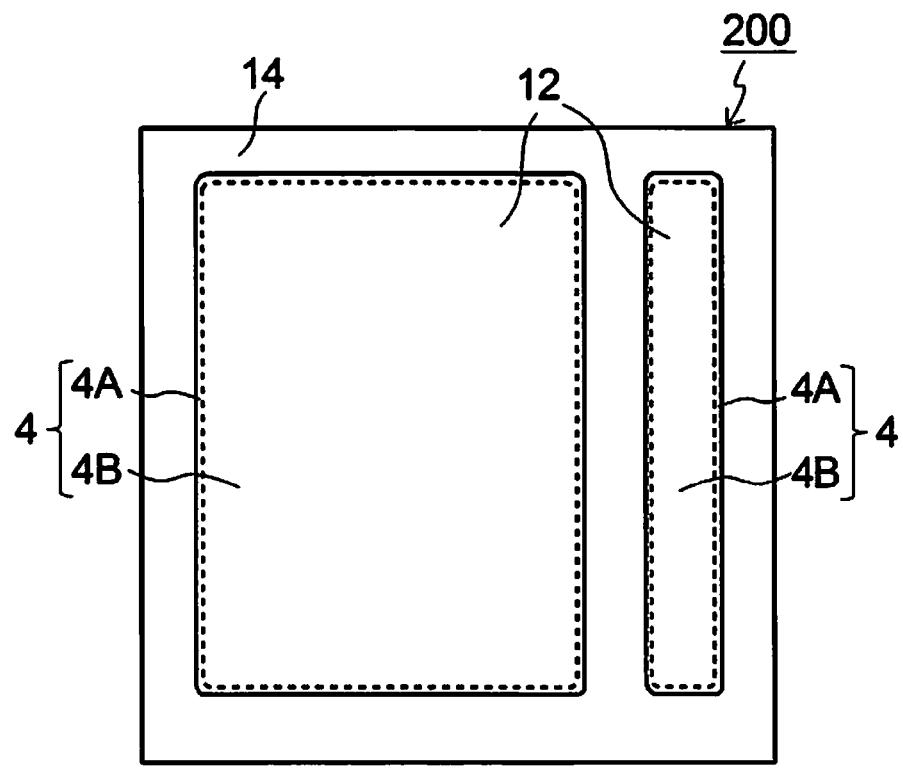
FIG. 3C is a schematic bottom view illustrating the light emitting device of FIG. 3A.

FIG. 3A is a schematic cross sectional view of a light emitting device 200 according to Embodiment 3, and FIG. 3B is a partial enlarged view of the lead 12, and FIG. 3C is a schematic bottom view illustrating the light emitting device 200. In Embodiment 3, the silver layer 42, which is the second plating layer 4B provided to the lower surface of the metal board 2, is formed in the same thickness as the silver layer 42 in the first plating layer 4A. The first plating layer 4A has the nickel layer 41 formed as an underlayer of the silver layer 42, and the silver layer 42 is formed over it, and the silver layer 42 of the second plating layer 4B is formed at the same time as the silver layer 42 in the first plating layer 4A. This method results in the surface of the first plating layer 4A and the surface of the second plating layer 4B being provided at different heights on the lower surface of the metal board 2. Specifically, the first plating layer 4A sticks out beyond the second plating layer 4B. As shown in FIG. 3C, on the lead 12 which is exposed at the lower surface of the light emitting device 200, the first plating layer 4A is formed at the portion in contact with the molded resin (i.e., outer periphery), and the second plating layer 4B is formed at the portion which is surrounded by the first plating layer 4A. The thickness of the first plating layer 4A is about between 1 and 100 μm, preferably about 5 to 75 μm, and more preferably about between 10 and 50 μm or about between 20 and 50 μm on the lead 12 which is exposed at the lower surface of the light emitting device 200. The width of the first plating layer 4A may be one of variable options such as partially-wide or partially-narrow width as well as a linear shape as shown in FIG. 3C. In this case, an average width may be within the above ranges.

Thus providing plating layer of different heights on the lower surfaces of the leads 12 affords better joinability with solder. Specifically, the first plating layer 4A sticks out beyond the second plating layer 4B, and the first plating layer 4A is provided so as to be substantially flush with the molded resin. The surface of the second plating layer 4B is formed as a surface that is lower than this. When this light emitting device 200 is mounted on a secondary substrate, there is more soldering surface area between the second plating layer 4B and the secondary substrate. This improves joinability between the light emitting device and the secondary substrate.

EMBODIMENT 4

Figure 4:
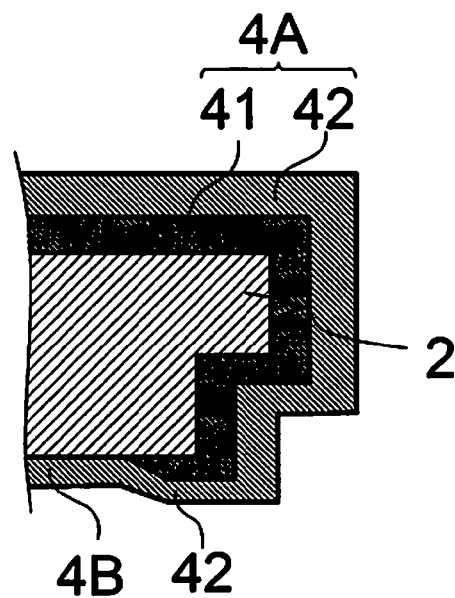
FIG. 4 is a schematic cross sectional view illustrating part of the lead according to another embodiment.

FIG. 4 is an enlarged view of the lead 12. In Embodiment 4, the thickness of the nickel layer 41, which is the first plating layer 4A provided to the lower surface of the metal board 2, varies, and is not uniform. More precisely, this is the same as Embodiment 2 in that the thickness decreases as it is farther away from the end of the lower surface of the metal board 2. Further, the silver layer 42, which is the second plating layer 4B provided to the lower surface of the metal board 2, is formed with the same thickness as that of the silver layer 42 in the first plating layer 4A. The first plating layer 4A has the nickel layer 41 formed as an underlayer of the silver layer 42, and the silver layer 42 is formed over it. The silver layer 42 of the second plating layer 4B is formed at the same time as the silver layer 42 of the first plating layer 4A. This results in the surface of the first plating layer 4A and the surface of the second plating layer 4B being provided at different heights on the lower surface of the metal board 2. Specifically, the first plating layer 4A extends beyond the second plating layer 4B.

INDUSTRIAL APPLICABILITY

The light source device of the present invention can be used in a variety of light sources, such as a lighting-use light source, various kinds of indicator-use light source, a light source installed in/on a vehicle, a display-use light source, a light source for a liquid crystal backlight, sensor-use light source, and signaling devices. Also, it is applicable to all the light-emitting device using leads such as a side-view type light emitting device.

What is claimed is:
1. A light emitting device, comprising:
   a package equipped with
      a lead having an upper surface and a lower surface, and a metal board and a plating layer, the upper surface including a mounting portion, the metal board whose main component is copper, the plating layer including a first plating layer and a second plating layer which are provided on the lower surface of the metal board, the first plating layer containing silver and nickel and wrapping around the edge of the metal board, and the second plating layer containing no nickel and being formed on at least part of a region below the mounting portion,
      a molded resin that holds the lead so that the lower face of the lead is exposed to the outside;
   a light emitting element mounted on the mounting portion; and
   a sealing member that seals the light emitting element.
2. The light emitting device according to claim 1, wherein the first plating layer includes palladium plating layer between nickel plating layer and silver plating layer.
3. The light emitting device according to claim 1, wherein the second plating layer includes silver plating layer.
4. The light emitting device according to claim 1, wherein the first plating layer protrudes more than the second plating layer.
5. The light emitting device according to claim 1, wherein the second plating layer is provided on an entire region below the mounting portion of the metal board.
6. The light emitting device according to claim 1, wherein the first plating layer is located at an edge portion of the lower surface of the lead.
7. The light emitting device according to claim 1, wherein the first plating layer is further provide on one portion of the upper surface and a lateral side surface of the lead.

8. The light emitting device according to claim 1, wherein the first plating layer is formed so as to extend integrally and continuously on the lower surface of the lead, a lateral side surface of the lead, and the upper surface of the lead.

9. The light emitting device according to claim 1, wherein the first plating layer includes a nickel plating layer, and the nickel plating layer has different thicknesses at the lower surface of the lead.

10. The light emitting device according to claim 1, wherein the first plating layer and the second plating layer contact each other at the lower surface of the lead.

11. The light emitting device according to claim 1, wherein an outermost surface of the first plating layer and an outermost surface of the second plating layer are formed of the same plating component.

12. The light emitting device according to claim 1, wherein the second plating layer has a multi-layer structure that includes a layer containing Au and a layer containing Ag.

13. The light emitting device according to claim 1, wherein a total layer thickness of each of the first plating layer and the second plating layer is 1 µm to 14 µm.

14. The light emitting device according to claim 1, wherein the light emitting element includes a reflective layer at a lateral side surface of the light emitting element.

15. The light emitting device according to claim 1, wherein the lead further has an exposed portion at an outer side surface of the package.

16. The light emitting device according to claim 1, wherein a surface of the first plating layer is substantially flush with a surface of the second plating layer at the lower surface of the lead.

17. The light emitting device according to claim 1, wherein a surface of the first plating layer, a surface of the second plating layer, and a surface of the molding resin are substantially flush with each other at the lower surface of the lead.

* * * * *